United States Patent
Aqad et al.

(10) Patent No.: US 9,601,325 B2
(45) Date of Patent: Mar. 21, 2017

(54) AROMATIC RESINS FOR UNDERLAYERS

(71) Applicants: Rohm and Haas Electronic Materials LLC, Marlborough, MA (US); Rohm and Haas Electronic Materials Korea Ltd., Cheonan (KR)

(72) Inventors: Emad Aqad, Northborough, MA (US); Mingqi Li, Shrewsbury, MA (US); Shintaro Yamada, Shrewsbury, MA (US); Sung Wook Cho, Gyeonggi-do (KR)

(73) Assignees: Rohm and Haas Electronic Materials LLC, Marlborough, MA (US); Rohm and Haas Electronic Materials Korea Ltd. (KR)

( * ) Notice: Subject to any disclaimer, the term of this patent is extended or adjusted under 35 U.S.C. 154(b) by 0 days.

(21) Appl. No.: 14/741,734

(22) Filed: Jun. 17, 2015

(65) Prior Publication Data

US 2015/0368504 A1 Dec. 24, 2015

Related U.S. Application Data

(60) Provisional application No. 62/016,118, filed on Jun. 24, 2014.

(51) Int. Cl.
*G03F 7/40* (2006.01)
*H01L 21/02* (2006.01)
*C09D 171/00* (2006.01)
*C08G 65/40* (2006.01)
*G03F 7/09* (2006.01)

(52) U.S. Cl.
CPC .... *H01L 21/02118* (2013.01); *C08G 65/4012* (2013.01); *C09D 171/00* (2013.01); *G03F 7/091* (2013.01); *G03F 7/094* (2013.01); *G03F 7/40* (2013.01)

(58) Field of Classification Search
CPC .. C08G 65/4012; C08G 65/48; C09D 171/00; G03F 7/091; G03F 7/09; G03F 7/40; G03F 7/094; H01L 21/02118
See application file for complete search history.

(56) References Cited

U.S. PATENT DOCUMENTS

| | | | |
|---|---|---|---|
| 6,060,170 A | 5/2000 | Burgoyne, Jr. | |
| 6,117,967 A | 9/2000 | Fuller et al. | |
| 6,174,636 B1* | 1/2001 | Fuller | G03G 5/0567 430/56 |
| 6,177,238 B1* | 1/2001 | Fuller | B41J 2/14129 347/20 |
| 2002/0022196 A1* | 2/2002 | Pavelchek | G03F 7/091 430/311 |
| 2013/0189533 A1 | 7/2013 | Okuyama et al. | |

FOREIGN PATENT DOCUMENTS

| | | | | |
|---|---|---|---|---|
| CN | 101717504 A | * | 6/2010 | |
| CN | 101724165 A | * | 6/2010 | |
| CN | 101735591 A | * | 6/2010 | |
| CN | 103811776 A | * | 5/2014 | |
| JP | 2008-15223 A | * | 1/2008 | |
| JP | 04831324 B | | 12/2011 | |
| JP | 04831324 B2 | | 12/2011 | |
| WO | 2013080929 A1 | | 6/2013 | |

OTHER PUBLICATIONS

English translation of CN 103811776 a generated Mar. 26, 2015 from ESPACENET 17 pages.*
English translation of CN 101735591 A generated Mar. 26, 2015 from ESPACENET 20 pages.*
English translation of CN 101724165 A generated Mar. 26, 2015 from ESPACENET 20 pages.*
English translation of CN 101717504 A generated Mar. 26, 2015 from ESPACENET 14 pages.*
Search report for corresponding Taiwan Application No. 104119938 dated Mar. 25, 2016.

* cited by examiner

*Primary Examiner* — Cynthia Hamilton
(74) *Attorney, Agent, or Firm* — S. Matthew Cairns

(57) ABSTRACT

Aromatic resin polymers and compositions containing them are useful as underlayers in semiconductor manufacturing processes.

10 Claims, No Drawings

AROMATIC RESINS FOR UNDERLAYERS

The present invention relates generally to field of manufacturing electronic devices, and more specifically to the field of materials for use in semiconductor manufacture.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer include chemical vapor deposited (CVD) carbon and solution processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution processed high-carbon content materials as underlayers. The ideal underlayer needs to meet the following properties: capable of being cast onto a substrate by a spin-coating process, thermal-set upon heating with low out-gassing and sublimation, soluble in common processing solvents for good equipment compatibility, have appropriate n/k ratio to work in conjunction with currently used silicon hardmask and bottom antireflectant (BARC) layers to impart low reflectivity necessary for photoresist imaging and thermally stable up to >400° C. so as to not be damaged during subsequent silicon-oxy-nitride (SiON) CVD processes.

It is well-known that materials of relatively low molecular weight have relatively low viscosity, and flow into features in a substrate, such as vias and trenches, to afford planarizing layers. Underlayer materials must be able to planarize with relatively low out-gassing up to 400° C. For the use as a high-carbon content underlayer, it is imperative for any composition to be thermally set upon heating. International Patent Application WO 2013/080929 discloses thermal-setting underlayer compositions having a material of the formula:

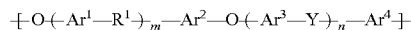

where $Ar^1$, $Ar^2$, $Ar^3$ and $Ar^4$ each represent a divalent aromatic group, $R^1$ represents a single bond or a $C_{1-20}$ divalent hydrocarbon; Y represents a carbonyl or sulfonyl group; m is 0 or 1; and n is 0 or 1. A relatively low molecular weight crosslinking additive is used in these compositions in order to provide the desired underlayer properties. However, such relatively low molecular weight crosslinking additives are prone to undesired out-gassing or sublimation during the curing process. The semiconductor industry is still searching for compositions suitable for forming underlayers meeting industry requirements and that do not have components that out-gas or sublime during subsequent heating steps.

The present invention solves this problem by providing a self-crosslinking composition (or crosslinking-additive free composition) suitable for underlayer applications. The present invention provides a composition comprising a polymer comprising one or more repeat units of formula (1):

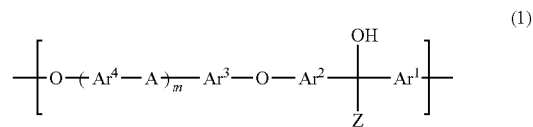

wherein $Ar^1$, $Ar^2$, $Ar^3$ and $Ar^4$ independently represent an optionally substituted divalent aryl moiety; A is a chemical bond, O, —C(O)O—, —C(O)NR—, or a $C_{1-60}$ divalent hydrocarbyl group; Z represents H, an optionally substituted $C_{1-30}$ alkyl moiety, an optionally substituted $C_{2-30}$ alkenyl moiety, an optionally substituted $C_{2-30}$ alkynyl moiety, an optionally substituted $C_{7-30}$ aralkyl moiety, or an optionally substituted $C_{6-20}$ aryl moiety; R represents a H or a $C_{1-30}$ hydrocarbyl moiety; and m is 0 or 1; and an organic solvent. Optionally, one or more additives chosen from curing agents, crosslinking agents, and surfactants may be used in the composition.

Also provided by the present invention is a polymer comprising one or more repeat units of formula (1):

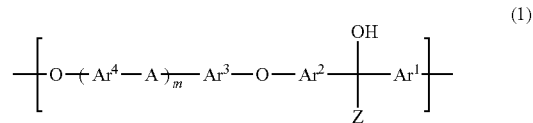

wherein $Ar^1$, $Ar^2$, $Ar^3$ and $Ar^4$ independently represent an optionally substituted divalent aryl moiety; A is a chemical bond, O, —C(O)O—, —C(O)NR—, or a $C_{1-60}$ divalent hydrocarbyl group; Z represents H, an optionally substituted $C_{1-30}$ alkyl moiety, an optionally substituted $C_{2-30}$ alkenyl moiety, an optionally substituted $C_{2-30}$ alkynyl moiety, an optionally substituted $C_{7-30}$ aralkyl moiety, or an optionally substituted $C_{C-20}$ aryl moiety; R represents a H or a $C_{1-30}$ hydrocarbyl moiety; and m is 0 or 1.

The present invention further provides a method of forming a patterned layer comprising disposing a layer of the composition described above on a substrate; removing organic solvent to form a polymeric underlayer; disposing a layer of a photoresist on the polymeric underlayer; exposing the photoresist layer to actinic radiation through a mask; developing the exposed photoresist layer to form a resist pattern; and transferring the pattern to the polymeric underlayer to expose portions of the substrate.

As used herein, when an element is referred to as being "disposed on" another element, it can be directly disposed on the other element or intervening elements may be present therebetween. In contrast, when an element is referred to as being "directly disposed on" another element, there are no intervening elements present.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; mmol=millimoles; g=gram; ppm=part per million; μm=micron=micrometer; nm=nanometer; Å=angstrom; L=liter; mL=milliliter; sec.=second; min.=minute; and hr.=hour. All amounts are percent by weight and all ratios are molar ratios, unless otherwise noted. All numerical ranges are inclusive and combinable in any order, except where it is clear that such numerical ranges are constrained to add up to 100%. The abbreviation "wt %" refers to percent by weight, based on the total weight of a referenced composition, unless otherwise noted.

As used throughout the specification, "feature" refers to the geometries on a substrate, and particularly on a semiconductor wafer. The term "alkyl" includes linear, branched and cyclic alkyl. Likewise, "alkenyl" refers to linear, branched and cyclic alkenyl, and "alkynyl" refers to linear and branched alkynyl. By the term "curing" it is meant any process, such as polymerization or condensation, that increases the molecular weight of a material or composition. "Curable" refers to any material capable of being cured (polymerized) under certain conditions. The term "oligomer" refers to dimers, trimers, tetramers and other relatively low molecular weight materials that are capable of further curing. The articles "a", "an" and "the" refer to the singular and the plural.

The polymers of the invention are aromatic resins that are particularly suitable for use in forming underlayers in a variety of electronic device manufacturing processes. The polymers of the invention comprise one or more repeat units (monomers) of formula (1):

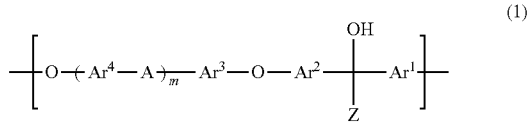

(1)

wherein $Ar^1$, $Ar^2$, $Ar^3$ and $Ar^4$ independently represent an optionally substituted divalent aryl moiety; A is a chemical bond, O, —C(O)O—, —C(O)NR—, or a $C_{1-60}$ divalent hydrocarbyl group; Z represents H, an optionally substituted $C_{1-30}$ alkyl moiety, an optionally substituted $C_{2-30}$ alkenyl moiety, an optionally substituted $C_{2-30}$ alkynyl moiety, an optionally substituted $C_{7-30}$ aralkyl moiety, or an optionally substituted $C_{6-20}$ aryl moiety; R represents a H or a $C_{1-30}$ hydrocarbyl moiety; and m is 0 or 1. Preferably, A is a chemical bond, O or a $C_{1-60}$ divalent hydrocarbyl group, and more preferably a chemical bond, O or a $C_{1-30}$ divalent hydrocarbyl group. Z is preferably H or an optionally substituted aryl moiety, and more preferably H, an unsubstituted aryl moiety or an hydroxy-substituted aryl moiety. It is preferred that m is 0 or 1. The present polymers may have any number of repeat units of formula (1), such as from n=1-500, where "n" is the number of repeat units in the polymer. Preferably, n=2-500, more preferably n=2-300, yet more preferably n=2 to 250 and even more preferably n=2 to 100. As used herein, "aryl moiety" refers to an aromatic ring system, which may be carbocyclic, heterocyclic, or a mixture thereof. The term "aryl moiety" includes: single aromatic rings such as phenyl or pyridyl; fused aromatic rings such as naphthyl, anthracenyl, pyrenyl, or quinolinyl; and fused ring systems having both aromatic and non-aromatic rings such as 1,2,3,4-tetrahydronaphthalene, 9,10-dihydroanthracene, or fluorene. Optionally, the aryl moiety may be substituted. As used herein, the term "substituted" alkyl, alkenyl, alkynyl, aralkyl, or aryl moiety refers to any alkyl, alkenyl, alkynyl, aralkyl, or aryl moiety having one or more of its hydrogens replaced with one or more substituents selected from $C_{1-30}$ alkyl, $C_{2-30}$ alkenyl, $C_{7-30}$ aralkyl, $C_{6-30}$ aryl, —$OR^3$, —$C_{1-30}$ alkylene-$OR^3$, and —$C_{1-30}$ alkylidene-$OR^3$; wherein $R^3$ is selected from H, $C_{1-30}$ alkyl, $C_{2-30}$ alkenyl, and $C_{6-30}$ aryl. Preferably, "substituted" alkyl, alkenyl, alkynyl, aralkyl, or aryl moiety refers to any alkyl, alkenyl, alkynyl, aralkyl, or aryl moiety having one or more of its hydrogens replaced with one or more substituents selected from $C_{1-20}$ alkyl, $C_{2-20}$ alkenyl, $C_{7-30}$ aralkyl, $C_{6-20}$ aryl, —$OR^3$, —$C_{1-20}$ alkylene-$OR^3$, and —$C_{1-20}$ alkylidene-$OR^3$; and more preferably from $C_{1-10}$ alkyl, $C_{2-12}$ alkenyl, $C_{7-30}$ aralkyl, $C_{6-20}$ aryl, —$OR^3$, —$C_{1-20}$ alkylene-$OR^3$, and —$C_{1-20}$ alkylidene-$OR^3$. Preferably, $R^3$ is selected from H, $C_{1-20}$ alkyl, $C_{2-20}$ alkenyl and $C_{6-20}$ aryl, more preferably H, $C_{1-10}$ alkyl, and $C_{6-20}$ aryl, and most preferably H.

A wide variety of aryl moieties may be used for each of $Ar^1$, $Ar^2$, $Ar^3$ and $Ar^4$, which may be unsubstituted or substituted. Such unsubstituted aryl moieties have from 5 to 30 carbons, preferably from 6 to 40 carbons, and more preferably from 6 to 35 carbons. Suitable aryl moieties include, but are not limited to: phenyl, biphenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, quinolonyl, 7,8-benzoquinolinyl, fluorenyl, and 12H-dibenzo[b,h]fluorenyl, each of which may by unsubstituted or substituted. Preferred aromatic moieties include: phenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, and fluorenyl. It is preferred that $Ar^1$ and $Ar^2$ are independently chosen from optionally substituted $C_{6-30}$ aryl moieties, more preferably $C_{6-40}$ carbocyclic aryl moieties, and even more preferably unsubstituted $C_{6-30}$ carbocyclic aryl moieties. Preferably, $Ar^1=Ar^2$. Preferred aryl moieties for $Ar^1$ and $Ar^2$ are phenyl, naphthyl, anthracenyl, phenanthryl, pyrenyl, triphenylenyl, perylenyl, and fluorenyl. $Ar^3$ and $Ar^4$ are preferably chosen from $C_{6-40}$ aryl moieties, and more preferably from $C_{6-35}$ aryl moieties, which may be unsubstituted or substituted. It is preferred that $Ar^3$ and $Ar^4$ are unsubstituted. Preferred aryl moieties for $Ar^3$ and $Ar^4$ are phenyl, naphthyl, anthracenyl, phenanthryl, pyrenyl, triphenylenyl, perylenyl, fluorenyl, and the aryl moieties of formulae (2a) and (2b):

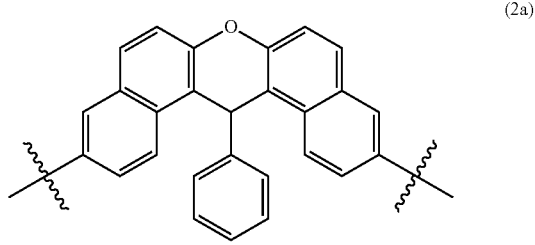

(2a)

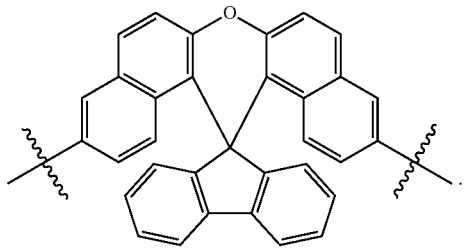

When m=1, it is preferred that $Ar^4=Ar^3$.

In formula (1) A is a chemical bond, O, —C(O)O—, —C(O)NR—, or a $C_{1-60}$ divalent hydrocarbyl group. When A is an ester or amide moiety, the carbonyl carbon may be bound to either $Ar^3$ or $Ar^4$. Preferably, A is a chemical bond, O or a $C_{1-60}$ divalent hydrocarbyl group, and more preferably a chemical bond, O or a $C_{1-30}$ divalent hydrocarbyl group. A wide variety of $C_{1-60}$ divalent hydrocarbyl groups may be used as A. Preferred $C_{1-60}$ divalent hydrocarbyl groups are $C_{1-30}$ alkylene, $C_{1-30}$ alkylidene, $C_{2-30}$ alkenylene, $C_{2-30}$ alkynylene, $C_{5-30}$ cycloalkylene, $C_{5-30}$ cycloalkenylene, $C_{6-30}$ arylene, and fullerene; and more preferably $C_{1-20}$ alkylene, $C_{1-20}$ alkylidene, and $C_{6-30}$ arylene. Particularly preferred $C_{1-60}$ divalent hydrocarbyl groups are —C($R^4$)$_2$—, where each $R^4$ is independently H, $C_{1-10}$ alkyl, or $C_{1-10}$ fluoroalkyl, such as —CH$_2$—, —C(CH$_3$)$_2$—, and —C(CF$_3$)$_2$—.

In formula (1) Z represents H, an optionally substituted $C_{1-30}$ alkyl moiety, an optionally substituted $C_{2-30}$ alkenyl moiety, an optionally substituted $C_{2-30}$ alkynyl moiety, an optionally substituted $C_{7-30}$ aralkyl moiety, or an optionally substituted $C_{6-20}$ aryl moiety, and preferably H, an optionally substituted $C_{1-30}$ alkyl moiety, an optionally substituted $C_{7-30}$ aralkyl moiety, or an optionally substituted $C_{6-20}$ aryl moiety, and more preferably H, an optionally substituted $C_{1-20}$ alkyl moiety, an optionally substituted $C_{7-20}$ aralkyl moiety, or an optionally substituted $C_{6-20}$ aryl moiety. Preferred cycloalkyl moieties for Z are those having from 3 to 30 carbons, preferably from 5 to 30 carbons, and more preferably from 6 to 30 carbons. Preferred cycloalkyl moieties are cyclopropyl, cyclopentyl, cyclohexyl. Any of the unsubstituted or substituted aryl moieties described above for $Ar^1$, $Ar^2$, $Ar^3$ and $Ar^4$ may suitably be used for Z. Preferred aryl moieties for Z are phenyl, hydroxyphenyl, biphenyl, naphthyl, hydroxynaphthyl, pyrenyl, and hydroxypyrenyl. More preferably, Z represents H, phenyl, hydroxyphenyl, biphenyl, naphthyl, hydroxynaphthyl, pyrenyl, and hydroxypyrenyl.

Preferred polymers of the invention are those having one or more repeat units chosen from:

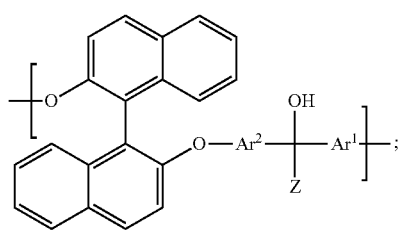

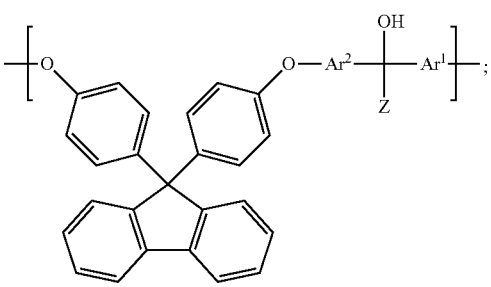

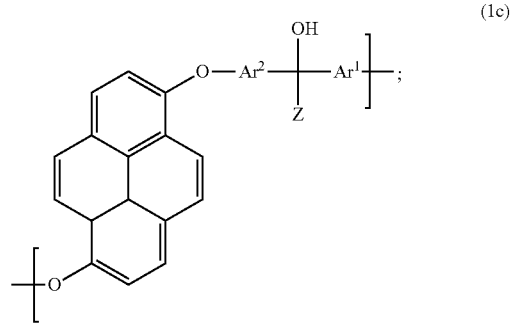

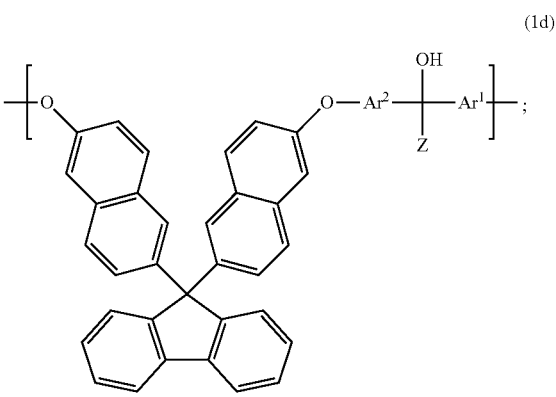

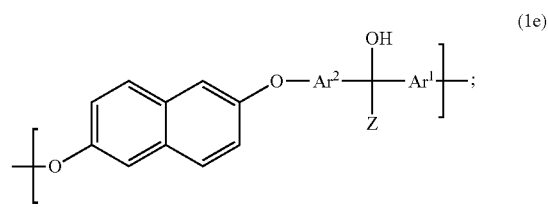

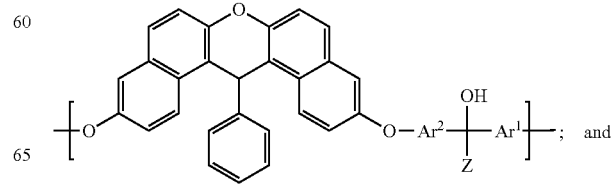

(1g)

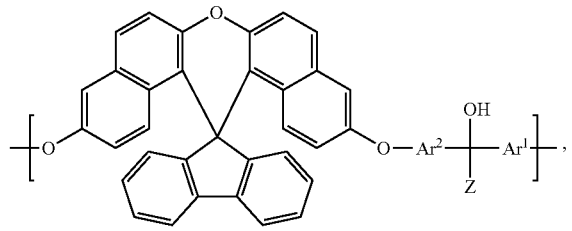

(1k)

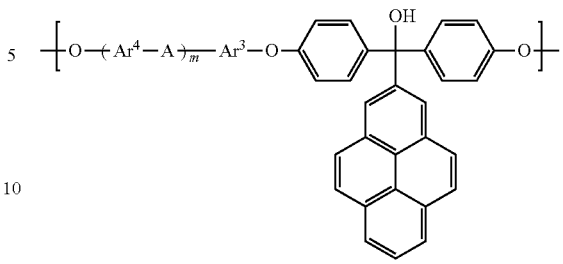

; and wherein Ar¹, Ar², and Z are as described above. Other preferred polymers are those having one or more repeat units chosen from:

(1h)

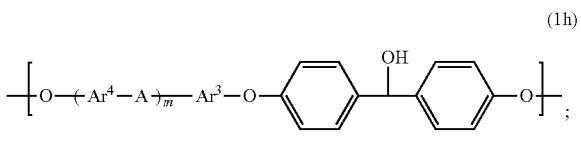
;

(1l)

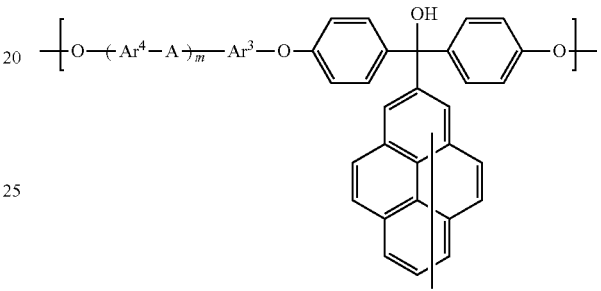
, wherein Ar³, Ar⁴, A and m are as described above.

Polymers of the invention may comprise a single monomer (repeat unit) or two or more different monomers (repeat units) of formula (1). Preferably, the present polymers comprise a single monomer of formula (1) or two different monomers of formula (1). When two different monomers of formula (1) are used in polymer of the invention, it is preferred that Ar¹, Ar² and Z in the first monomer are the same as Ar¹, Ar² and Z, respectively, in the second monomer. It is further preferred that at least one of Ar³, Ar⁴ and A in the first monomer is different from the corresponding Ar³, Ar⁴, and Z in the second monomer, and more preferably that each of Ar³, Ar⁴ and A in the first monomer is different from each of Ar³, Ar⁴, and Z, respectively, in the second monomer. Preferred polymers comprising two repeat units of the invention are those having the formulae:

(1i)

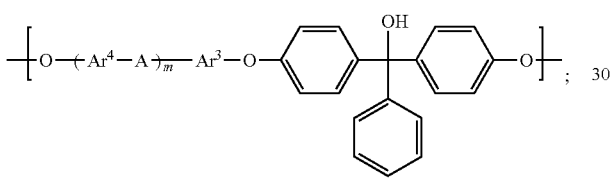
;

(1j)

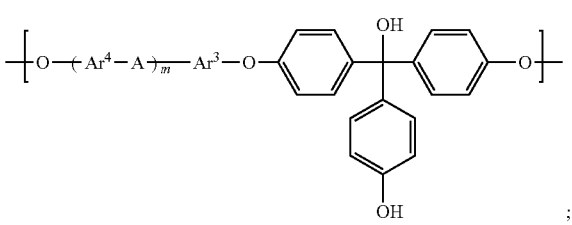
;

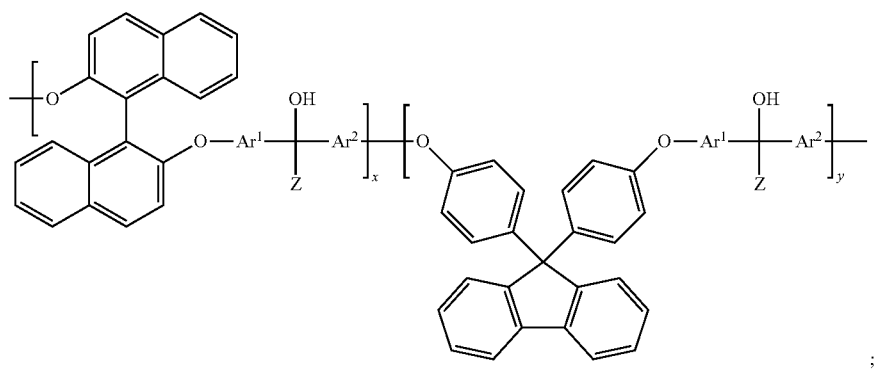
;

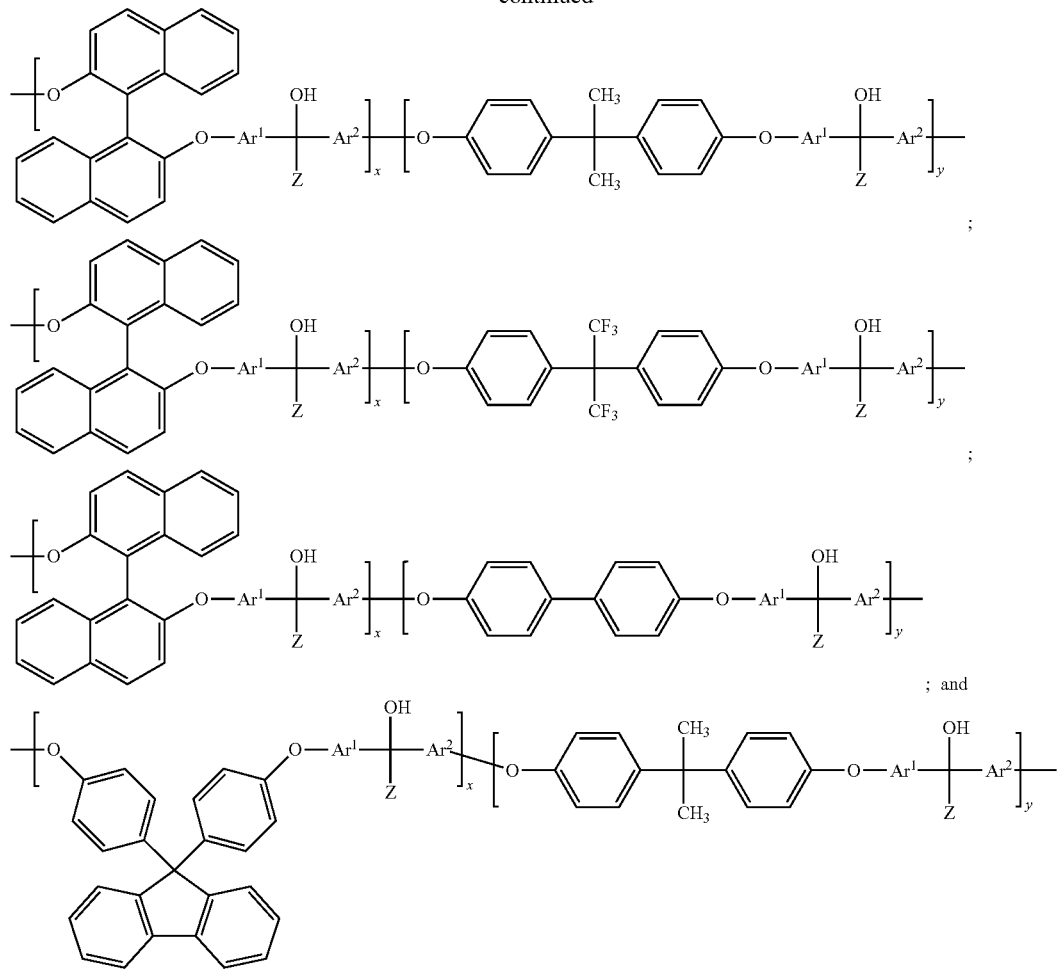

wherein $Ar^1$, $Ar^2$, and Z of each repeat unit are as described above, and x and y represent the number of each repeat units and are integers independently selected from 1 to 499, and wherein x+y=2 to 500. It will be appreciated that blends of polymers may be used in the present compositions, such as a blend of two or more polymers of the invention or a blend comprising one or more polymers of the invention and one or more other polymers suitable for use as an underlayer.

The polymers of the invention may be prepared by a variety of methods. One suitable method is to reduce a corresponding carbonyl containing polymer having formula (3) using a reducing agent, according to Scheme 1.

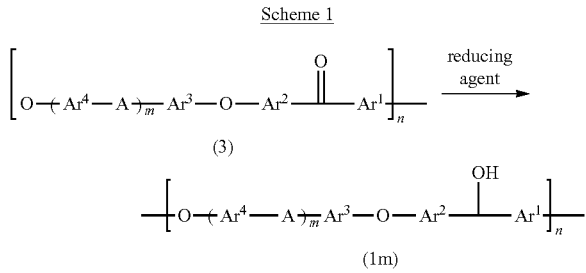

Suitable reducing agents are well-known in the art and include, but are not limited to, $NaBH_4$, $LiBH_4$ or $LiAlH_4$. Another suitable method for preparing the present polymers is to react an addition agent with a corresponding carbonyl polymer having formula (3), according to Scheme 2.

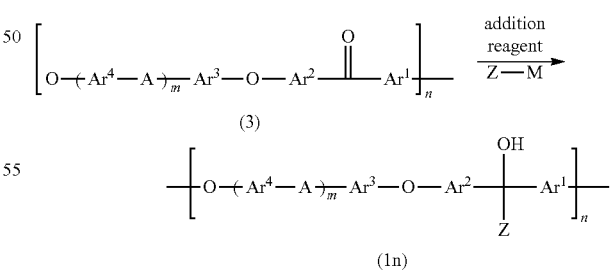

Suitable addition reagents are well-known in the art and include, but are not limited to, Grignard reagents or organo lithium reagents. The reactions described in Schemes 1 and 2 are carried out in a suitable solvent under reaction conditions well-known to those skilled in the art. The polymers of the invention may be used without further purification, or may be further purified using procedures known in the art.

Typically, the polymers of the invention have a weight average molecular weight ($M_w$) of $\geq 1000$, such as from 1000 to 50000. Preferably, the present polymers have a polydispersity ($M_w/M_n$) of $\geq 1.1$.

A suitable composition useful for forming an underlayer comprises one or more of the polymers (aromatic resins) described above, organic solvent, and optionally one or more additives chosen from curing agents and surfactants. It will be appreciated by those skilled in the art that other additives may suitably be used in the present compositions. Compositions of the invention may be prepared by combining the polymer, solvent, and any optional additives in any order. Typically, the amount of the present polymer in these compositions is from 2 to 20 wt %, and preferably from 3 to 15 wt %.

Any solvent may be used, provided that a sufficient amount of the aromatic resin reaction product is soluble in solvent, or solvent mixture, used. Such solvents include, but are not limited to, aromatic hydrocarbons, alcohols, lactones, esters, glycols, and glycol ethers. Mixtures of organic solvents may be used. Exemplary organic solvents include, without limitation, toluene, xylene, mesitylene, 2-methyl-1-butanol, 4-methyl-2-pentanol, methyl isobutyl carbinol, gamma-butyrolactone, ethyl lactate, methyl 2-hydroxyisobutyrate, propylene glycol methyl ether acetate, propylene glycol methyl ether, and cyclohexanone. It will be appreciated by those skilled in the art that the concentration of the aromatic resin reaction products in the solvent may be varied across a wide range and that the thickness of any film deposited by a spin-on technique depends on the concentration of the reaction products in the solvent.

Optionally, the present aromatic resin compositions may further comprise one or more curing agents to aid in the curing of the deposited aromatic resin film. A curing agent is any component which causes curing of the polymer on the surface of a substrate. Preferred curing agents are acids and thermal acid generators. Suitable acids include, but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators. The amount of such curing agents useful in the present compositions is well-known to those skilled in the art and is typically from 0 to 10 wt %, and preferably from 0 to 3 wt %.

The present compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. The amount of such surfactants useful in the present compositions is well-known to those skilled in the art, and typically is in the range of 0 to 5 wt %.

The present polymers are useful in the manufacture of various electronic devices, such as in a process of forming a patterned layer comprising disposing a layer of the composition described above on a substrate; removing organic solvent to form a polymeric underlayer; disposing a layer of a photoresist on the polymeric underlayer; exposing the photoresist layer to actinic radiation through a mask; developing the exposed photoresist layer to form a resist pattern; and transferring the pattern to the polymeric underlayer to expose portions of the substrate.

The present compositions may be disposed on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15-90 seconds to obtain a desired layer of the aromatic resin reaction product on the substrate. It will be appreciated by those skilled in the art that the height of the aromatic resin layer may be adjusted by changing the spin speed.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size, such as wafers having a diameter of 200 mm to 300 mm. As used herein, the term "semiconductor substrate" includes any substrate having one or more semiconductor layers or structures which include active or operable portions of semiconductor devices. A semiconductor device refers to a semiconductor substrate upon which at least one microelectronic device has been or is being batch fabricated.

After being deposited on the substrate, the polymeric (aromatic resin) underlayer is optionally baked at a relatively low temperature to remove any solvent and other relatively volatile components from the underlayer. Typically, the substrate is baked at a temperature of $\leq 150°$ C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate.

The aromatic resin underlayer is then sufficiently cured such that the film does not intermix with a subsequently applied organic layer, such as a photoresist or other organic layer disposed directly on the underlayer. The aromatic resin underlayer may be cured in an oxygen-containing atmosphere, such as air, or in an inert atmosphere, such as nitrogen and under conditions, such as heating, sufficient to provide a cured aromatic resin underlayer. Such conditions are sufficient to cure the film such that it does not intermix with a subsequently applied organic layer, such as a photoresist layer, while still maintaining the desired antireflective properties (n and k values) and etch selectivity of the underlayer film. This curing step is conducted preferably on a hot plate-style apparatus, though oven curing may be used to obtain equivalent results. Typically, such curing is performed by heating the aromatic resin layer at a curing temperature of ≥150° C., preferably from 150 to 450° C., and more preferably from 200 to 450° C. It is more preferred that the curing temperature is ≥250° C., and even more preferably from 250 to 450° C. The curing temperature selected should be sufficient to cure the aromatic resin underlayer. When a thermal acid generator is used, the curing temperature should be sufficient for the thermal acid generator to liberate acid to aid in curing of the aromatic resin. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times.

The initial baking step may not be necessary if the curing step is conducted in such a way that rapid evolution of the solvents and curing by-products is not allowed to disrupt the underlayer film quality. For example, a ramped bake beginning at relatively low temperatures and then gradually increasing to the range of 200 to 325° C. can give acceptable results. It can be preferable in some cases to have a two-stage curing process, with the first stage being a lower bake temperature of less than 200° C., and the second stage being a higher bake temperature preferably between 200 and 400° C. Two stage curing processes facilitate uniform filling and planarization of pre-existing substrate surface topography, for example filling of trenches and vias.

After curing of the aromatic resin underlayer, one or more processing layers, such as photoresists, silicon-containing layers, hardmask layers, bottom antireflective coating (or BARC) layers, and the like, may be disposed on the cured underlayer. For example, a photoresist may be disposed, such as by spin coating, directly on the surface of the cured aromatic resin underlayer. A wide variety of photoresists may be suitably used, such as those used in 193 nm lithography, such as those sold under the EPic™ brand available from Dow Electronic Materials (Marlborough, Mass.). Suitable photoresists may be either positive tone development or negative tone development resists. Following coating on the aromatic resin underlayer, the photoresist layer is then imaged (exposed) using patterned actinic radiation, and the exposed photoresist layer is then developed using the appropriate developer to provide a patterned photoresist layer. The pattern is next transferred from the photoresist layer to the underlayer by an appropriate etching technique. Typically, the photoresist is also removed during such etching step. Next, the pattern is transferred to the substrate and the underlayer removed by appropriate etching techniques known in the art, such as by plasma etching. Following patterning of the substrate, the underlayer is removed using conventional techniques. The electronic device substrate is then processed according to conventional means.

Alternatively, the cured aromatic resin underlayer may be used as the bottom layer of a multilayer resist process. In such a process, a layer of the aromatic resin reaction product is disposed on a substrate and cured as described above. Next, one or more middle layers are disposed on the aromatic resin underlayer. For example, a silicon-containing layer or a hardmask layer is disposed directly on the aromatic resin underlayer. Exemplary silicon-containing layers include a silicon-BARC, which may be spin coated on the underlayer followed by curing, or an inorganic silicon layer such as SiON or $SiO_2$ which may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is disposed directly on the silicon-containing layer (in a trilayer process) or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic resin underlayer is then patterned using appropriate etching techniques, such as $O_2$ or $CF_4$ plasma. Any remaining patterned photoresist and organic BARC layers are removed during etching of the aromatic resin underlayer. Next, the pattern is then transferred to the substrate, such as by appropriate etching techniques, which also removes any remaining silicon-containing layer or hardmask layer, followed by removal of any remaining patterned aromatic resin underlayer to provide a patterned substrate.

Aromatic reaction products of the invention may also be used in a self-aligned double patterning process. In such a process, a layer of an aromatic resin reaction product described above is disposed on a substrate, such as by spin-coating. Any remaining organic solvent is removed and the polymeric (aromatic resin) layer is cured to form an aromatic resin underlayer. A layer of a suitable photoresist is then disposed on the cured aromatic resin underlayer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the aromatic resin underlayer by an appropriate etching technique to expose portions of the substrate. Typically, the photoresist is also removed during such etching step. Next, a conformal silicon-containing layer is disposed over the patterned polymeric reaction product layer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned aromatic resin underlayer and a portion of the substrate. Following this partial etching step, the pattern on the substrate comprises a plurality of features, each feature comprising a line or post of the aromatic resin underlayer with the silicon-containing layer directly adjacent to the sides of each aromatic resin underlayer feature. Next, the aromatic resin underlayer is removed, such as by etching, to expose the substrate surface that was under the aromatic resin underlayer pattern, and providing a patterned silicon-containing layer on the substrate surface, where such patterned silicon-containing layer is doubled (that is, twice as many lines and/or posts) as compared to the patterned aromatic resin underlayer.

An advantage of the present polymers is that they are self-crosslinking, that is, they are able to crosslink themselves to form a cured underlayer without the use of a separate crosslinking agent. Crosslinking agents are relatively low molecular weight components, as compared to the aromatic resins used to form underlayers. By avoiding the use of such relatively low molecular weight crosslinking agents, underlayers formed from the present compositions have significantly reduced out-gassing as compared to aromatic resin underlayers that require the use of a crosslinking agent, such as those disclosed in WO 2013/080929.

EXAMPLE 1

Synthesis of Polymer-B1

Polymer-B1 was prepared by the reaction sequence shown in Scheme 3.

Scheme 3:

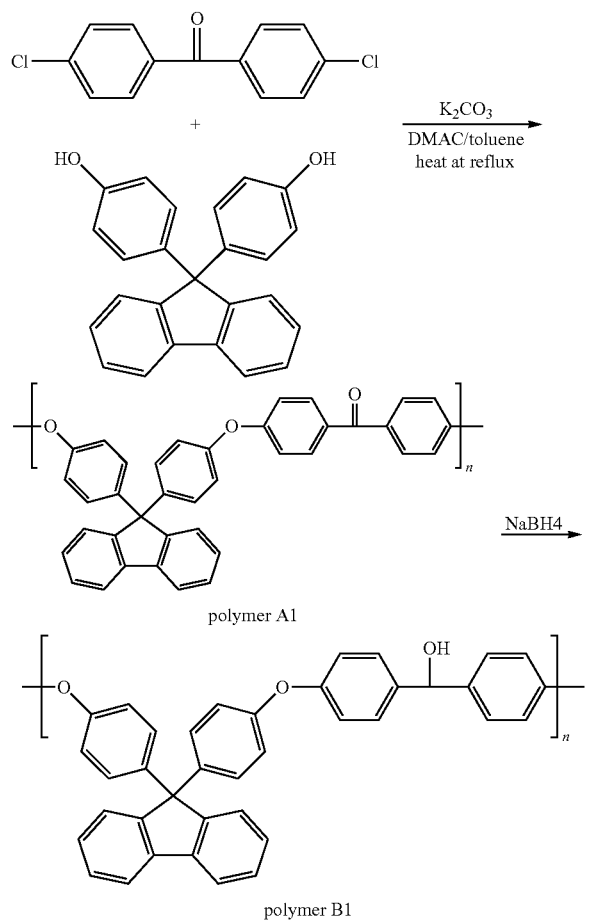

polymer A1 polymer B1

A 1-L 3-neck round-bottom flask equipped with a Dean-Stark trap, condenser and a nitrogen inlet was situated in a silicon oil bath. 4,4'-Dichlorobenzophenoe (16.6 g, 66.10 mmol, Aldrich), 9,9-bis(4-hydroxyphenyl)fluorene (25 g, 71.34 mmol, Aldrich), potassium carbonate (21.9 g, 158.47 mmol), anhydrous N,N-dimethylacetamide (150 mL) and toluene (25 mL) were added to the flask and heated to 175° C. (oil bath temperature) while the volatile toluene component was collected and removed. After heating for 16 hr, at 175° C. with continuous stirring, the reaction mixture was filtered to remove insoluble salts, and the resultant solution was added to methanol (2.5 L) to precipitate polymer-A1, which was isolated by filtration and the wet filter cake was washed with water (2 L) and then with methanol (2 L). The yield of the vacuum dried Polymer-A1 was 33.5 g. GPC analysis of polymer-A1 showed that the polymer had a molecular weight $M_w$ of 10600 and polydispersity $M_w/M_n$ of 2.04 in terms of standard polystyrene.

The reduction of the carbonyl groups in Polymer-A1 was achieved as follows. A solution made of 1.80 g of sodium borohydride was added to dimethylsulfoxide (30 mL) and the mixture was stirred at 40° C. for 15 min. To the resulting clear solution was added a solution of 15 g polymer-A1 in 130 mL THF. Then the mixture was stirred at 70° C. (oil bath temperature) for 5 hr. Next, the reaction mixture was cooled to room temperature and quenched by slow addition of 20 mL of 1 N aqueous solution of ammonium chloride. The resulting solution was poured into 2 L of methanol to precipitate Polymer-B1, which was isolated by filtration and the wet filter cake was washed with water (2 L) and then with methanol (1 L). The yield of the vacuum dried Polymer-B1 was 13.0 g. GPC analysis of polymer-B1 showed that the polymer had a molecular weight $M_w$ of 11500 and polydispersity $M_w/M_n$ of 1.91 in terms of standard polystyrene. The complete reduction of the carbonyl groups in Polymer-A1 was further confirmed by $^{13}C$ NMR of polymer-B1 which contained no typical carbonyl group signal at 194.5 ppm (which is present in the $^{13}C$ NMR spectra of Polymer-A1) and instead contained the signature signal for the sec-benzyl alcohol carbon at 75.3 ppm.

EXAMPLE 2

Synthesis of Polymer-B2

Polymer-B2 was prepared by the reaction sequence shown in Scheme 4.

Scheme 4

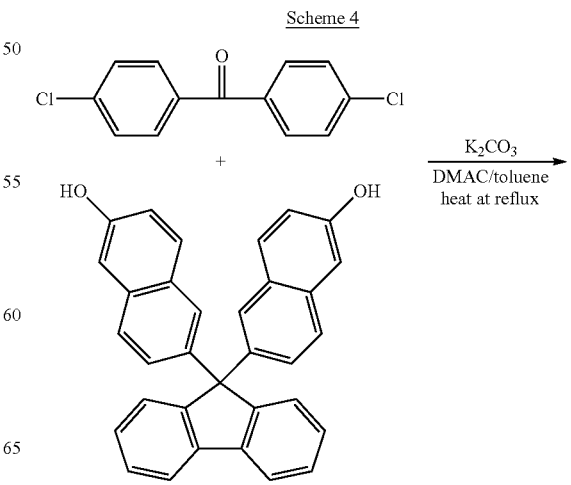

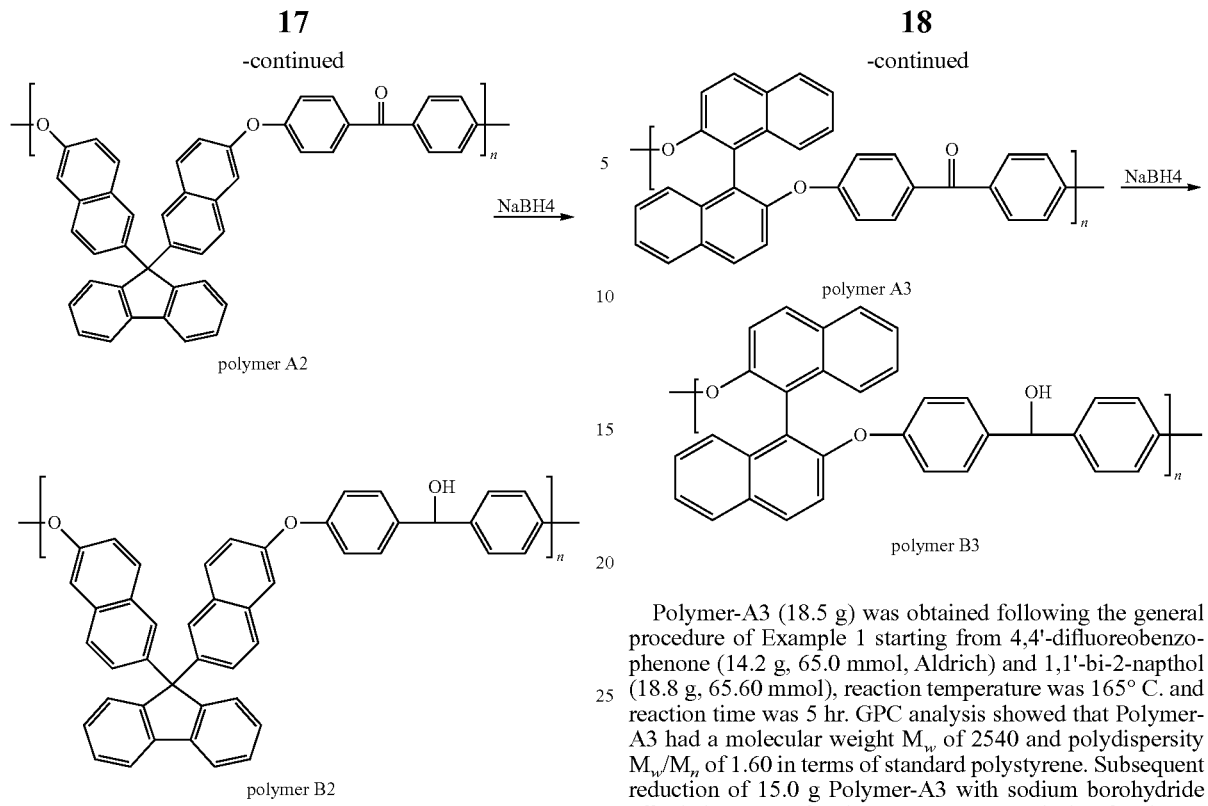

polymer A2 polymer B2

Polymer-A2 was obtained according to the general procedure of Example 1 starting from 4,4'-dichlorobenzophenoe (5.16 g, 20.55 mmol, Aldrich) and 6,6'-(9H-fluorene-9,9-diyl)-bis-naphthalene-2-ol (10.0 g, 22.20 mmol) to produce 12.2 g of Polymer-A2. Subsequent reduction of 5.0 g Polymer-A2 with sodium borohydride afforded 4.8 g Polymer-B2. GPC analysis of polymer B-2 showed that the polymer has a molecular weight $M_w$ of 11950 and polydispersity $M_w/M_n$ of 2.45 in terms of standard polystyrene.

EXAMPLE 3

Synthesis of Polymer-B3

Polymer-B3 was prepared by the reaction sequence shown in Scheme 5.

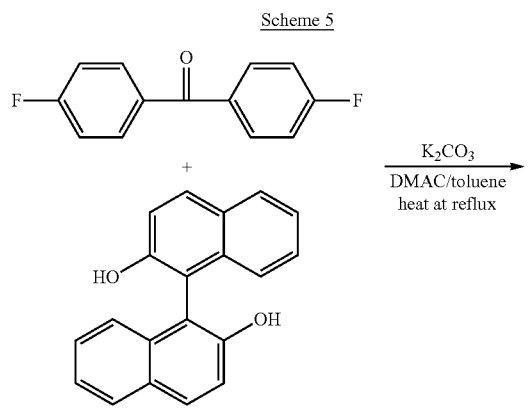

Scheme 5 polymer A3 polymer B3

Polymer-A3 (18.5 g) was obtained following the general procedure of Example 1 starting from 4,4'-difluoreobenzophenone (14.2 g, 65.0 mmol, Aldrich) and 1,1'-bi-2-napthol (18.8 g, 65.60 mmol), reaction temperature was 165° C. and reaction time was 5 hr. GPC analysis showed that Polymer-A3 had a molecular weight $M_w$ of 2540 and polydispersity $M_w/M_n$ of 1.60 in terms of standard polystyrene. Subsequent reduction of 15.0 g Polymer-A3 with sodium borohydride afforded 12.5 g of Polymer-B3. GPC analysis of Polymer B-3 showed that the polymer had a molecular weight $M_w$ of 2910 and polydispersity $M_w/M_n$ of 1.6 in terms of standard polystyrene.

EXAMPLE 4

Synthesis of Polymer-B4

Polymer-B4 was prepared by the reaction sequence shown in Scheme 6.

Scheme 6

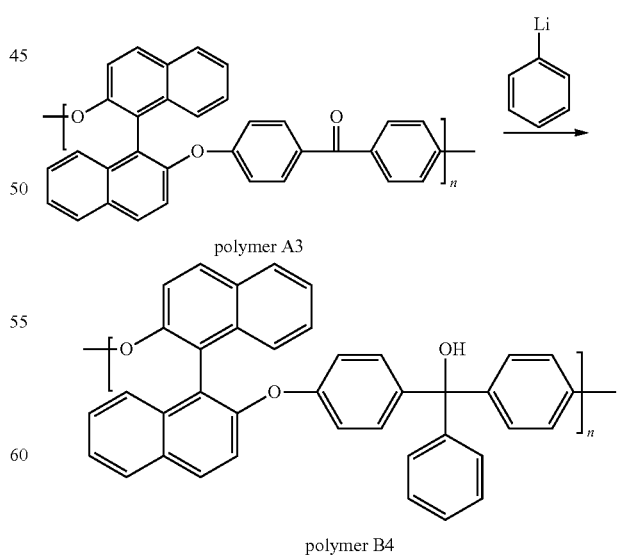

polymer A3 polymer B4

A 0.5 L 3-neck round-bottom flask equipped with a Dean-Stark trap, condenser and a nitrogen inlet was situated in a silicon oil bath. Polymer-A3 (15 g, molecular weight $M_w$ of 3400 and polydispersity $M_w/M_n$ of 1.80 in terms of standard polystyrene) and 150 mL of toluene were added to the flask and heated to reflux while collecting toluene in the Dean-Stark trap. The reflux was stopped after collecting 50 mL of toluene. The resulting dry toluene solution of Polymer-A3 was cooled to 0° C. and 15 mL of 1.8 M phenyl lithium (Aldrich) solution in dibutyl ether was slowly added to the polymer solution. To the resulting viscous solution was added 100 mL of dry tetrahydrofuran followed by slow addition of additional 35 mL of 1.6 M phenyl lithium solution in dibutyl ether. After complete addition of phenyl lithium, the mixture was stirred at 0° C. for 30 min. followed by stirring at room temperature for 1 hr. Next, methanol (5 mL) was added slowly followed by 5 mL of water. The mixture was stirred at room temperature for 30 min. and then 20 mL of 0.05 N aqueous hydrochloric acid solution was added. The organic phase was separated and poured slowly into 1 L of methanol to precipitate Polymer-B4, which was isolated by filtration and washed with water (1 L) and then methanol (1 L). The crude Polymer-B4 (12.1 g) was re-dissolved in 30 mL THF and the solution was poured into 1 L of methanol. The precipitated Polymer-B4 was filtered and dried. The yield of the vacuum dried Polymer-B4 was 9.5 g. GPC analysis of Polymer-B4 showed that the polymer had a molecular weight $M_w$ of 4970 and polydispersity $M_w/M_n$ of 1.68 in terms of standard polystyrene.

EXAMPLE 5

Thermal stability for bulk and thermally cured polymers were measured by Thermal Gravimetric Analysis (TGA). Polymer-B1, Polymer-B2, and Polymer-B3 were individually formulated in cyclohexanone at 10 wt % solid. The solutions were then filtered through 0.2 μm poly(tetrafluoroethylene) (PTFE) syringe filter, coated on a silicon wafer at 1500 rpm and baked at 100° C. for 60 sec. to remove the solvent and further cured at 400° C. for 60 sec. The cured films were scraped off the wafers, and TGA thermogram was collected. The results of the TGA analysis are reported in Table 1.

TABLE 1

| Polymer | Before curing (bulk) | | After curing | |
|---|---|---|---|---|
| | Wt % lost at 400° C. | Temperature at 10% weight loss | Wt % loss at 400° C. | Temperature at 10% weight loss |
| Polymer-B1 | 11.5 | 326° C. | 1.8 | 480° C. |
| Polymer-B2 | 5.1 | 514° C. | 1.1 | 538° C. |
| Polymer-B3 | 4.4 | 436° C. | 1.3 | 507° C. |

EXAMPLE 6

Etching Test

Polymer-B1, Polymer-B2, Polymer-B3, and Polymer-A1 (as a comparative) were individually formulated in cyclohexanone at 10 wt % solid. The solutions were then filtered through 0.2 μm PTFE syringe filter, coated on a silicon wafer at 1500 rpm and baked at 100° C. for 60 sec. to remove the solvent and further cured at 400° C. for 60 sec. The etch characteristics of each cured film were using $O_2$, $CF_4$ and $CF_4/O_2$ etches. The etch rate was calculated from the etch time and the difference in thickness of the film before and after etching. Etching tests were carried out using Plasmatherm RIE790 from Plasma-Therm Co., and the etching conditions are summarized in Table 2.

TABLE 2

| | Condition 1 | Condition 2 |
|---|---|---|
| Gas | $O_2$ | $CF_4$ |
| Flow(sscm) | 60 | 50 |
| Power(W) | 700 | 500 |
| Pressure (mTorr) | 10 | 10 |

The etch rates of the polymers evaluates are reported in Table 3.

TABLE 3

| Polymer | $O_2$ etch (Å/sec.) | $CF_4$ etch (Å/sec.) |
|---|---|---|
| Polymer-B1 | 33.1 | 5.2 |
| Polymer-B2 | 32.3 | 4.5 |
| Polymer-B3 | 28.1 | 5.2 |
| Polymer-B4 | 29.9 | 4.4 |
| Polymer A1 (Comparative) | 35.2 | 4.8 |

EXAMPLE 7

Solvent Resistance

Polymer-B1, Polymer-B2, Polymer-A1 (Comparative), and Polymer-A3 (Comparative) were individually formulated in cyclohexanone and triethylammonium p-toluenesulfonate as a thermal acid generator (TAG) in the amount shown in Table 4. The amount of the TAG added was based on the total solid % of the composition. The solutions were then filtered through a 0.2 μm PTFE syringe filter, coated on a silicon wafer at 1500 rpm and cured for 60 sec. at temperatures indicated in Table 4. Solvent resistance was evaluated by applying a puddle of cyclohexanone for 90 sec. on each cured film. Film thickness (in Å) was measured before (FT Before) and after (FT After) the solvent treatment, and the solvent resistance was determined as (FT Before)/(FT After)×100(%) and is reported as "% Film Retention". From this result, it is clear that the polymers of the invention (Polymer-B1 and Polymer-B3) showed significantly improved solvent resistance compared to the corresponding ketone form (comparatives Polymer-A1 and Polymer-A3). This solvent resistance demonstrates the self-crosslinking ability of the polymers of the invention.

TABLE 4

| Polymer | TAG Amount (%) | Cure (° C.) | FT Before (Å) | FT After (Å) | % Film Retention |
|---|---|---|---|---|---|
| A3 (Comparative) | 0 | 200 | 2103 | 45 | 2.0 |
| A3 (Comparative) | 0 | 250 | 2105 | 60 | 2.8 |
| A3 (Comparative) | 0 | 300 | 2098 | 53 | 2.5 |
| A3 (Comparative) | 0 | 350 | 2085 | 81 | 3.9 |
| A3 (Comparative) | 2 | 200 | 2073 | 50 | 2.4 |
| A3 (Comparative) | 2 | 250 | 2072 | 39 | 1.9 |
| A3 (Comparative) | 2 | 300 | 2076 | 55 | 2.7 |
| A3 (Comparative) | 2 | 350 | 2046 | 44 | 2.1 |
| B3 | 0 | 200 | 2135 | 75 | 3.5 |
| B3 | 0 | 250 | 2146 | 110 | 5.1 |
| B3 | 0 | 300 | 2244 | 188 | 8.4 |
| B3 | 0 | 350 | 2148 | 684 | 31.8 |

TABLE 4-continued

| Polymer | TAG Amount (%) | Cure (° C.) | FT Before (Å) | FT After (Å) | % Film Retention |
|---|---|---|---|---|---|
| B3 | 2 | 200 | 2196 | 2266 | 103.2 |
| B3 | 2 | 250 | 2182 | 2150 | 98.6 |
| B3 | 2 | 300 | 2244 | 2195 | 97.8 |
| B3 | 2 | 350 | 2287 | 2258 | 98.7 |
| A1 (Comparative) | 0 | 200 | 2798 | 132 | 4.7 |
| A1 (Comparative) | 0 | 250 | 2782 | 1195 | 43.0 |
| A1 (Comparative) | 0 | 300 | 2778 | 1251 | 45.0 |
| A1 (Comparative) | 0 | 350 | 2788 | 2322 | 83.3 |
| B1 | 0 | 200 | 2698 | 155 | 5.8 |
| B1 | 0 | 250 | 2693 | 2711 | 100.7 |
| B1 | 0 | 300 | 2718 | 2731 | 100.5 |
| B1 | 0 | 350 | 2696 | 2710 | 100.5 |

What is claimed is:

1. A method of forming a patterned layer comprising disposing on a substrate a layer of a composition comprising a polymer comprising one or more repeat units of formula (1):

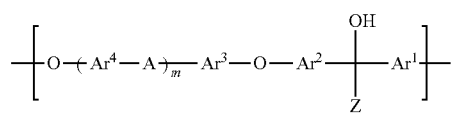

(1)

wherein Ar¹, Ar², Ar³ and Ar⁴ independently represent an optionally substituted divalent aryl moiety; A is a chemical bond, O, —C(O)O—, —C(O)NR—, or a $C_{1-60}$ divalent hydrocarbyl group; Z represents H, an optionally substituted $C_{1-30}$ alkyl moiety, an optionally substituted $C_{2-30}$ alkenyl moiety, an optionally substituted $C_{2-30}$ alkynyl moiety, an optionally substituted $C_{7-30}$ aralkyl moiety, or an optionally substituted $C_{6-20}$ aryl moiety; R represents a H or a $C_{1-30}$ hydrocarbyl moiety; and m is 0 or 1; and an organic solvent; removing organic solvent to form a polymeric underlayer; disposing a silicon-containing layer on the polymeric underlayer; disposing a layer of a photoresist on the silicon-containing layer; exposing the photoresist layer to actinic radiation through a mask; developing the exposed photoresist layer to form a resist pattern; and transferring the pattern to the silicon-containing layer and to the polymeric underlayer to expose portions of the substrate.

2. The method of claim 1 wherein the polymer comprises one or more repeat units chosen from

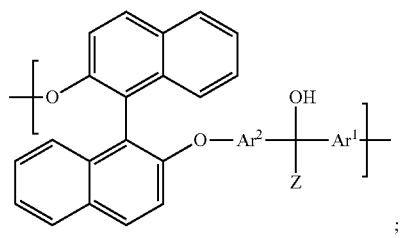

;

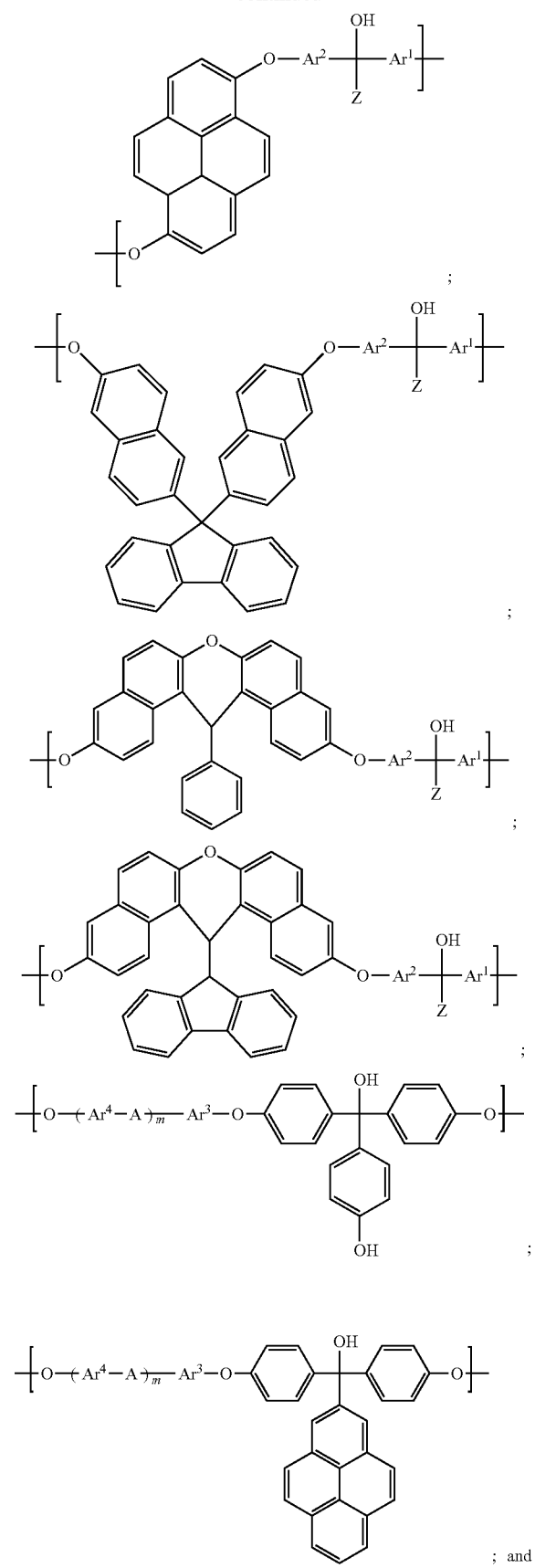

; and

-continued

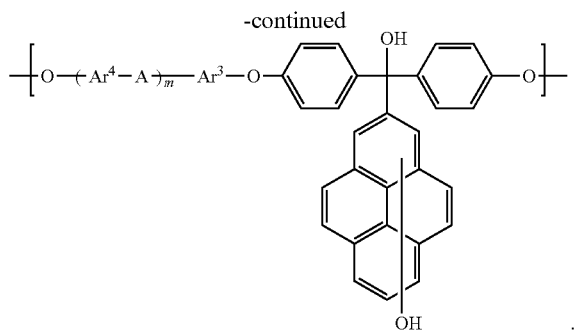

3. The method of claim 1 wherein the composition further comprises an acid or a thermal acid generator.

4. The method of claim 1 wherein A is chosen from a chemical bond, O or a $C_{1-60}$ divalent hydrocarbyl group.

5. The method of claim 4 wherein A is chosen from a chemical bond, O or $-C(R^4)_2-$, where each $R^4$ is independently H, $C_{1-10}$ alkyl, or $C_{1-10}$ fluoroalkyl.

6. The method of claim 1 wherein Z is chosen from H, an unsubstituted aryl moiety, or a hydroxy-substituted aryl moiety.

7. The method of claim 1 wherein the polymer comprises two or more different repeat units of formula (1).

8. The method of claim 1 further comprising the steps of patterning the substrate; and then removing the patterned polymeric underlayer.

9. The method of claim 1 wherein $Ar^1=Ar^2$.

10. A composition comprising a polymer chosen from

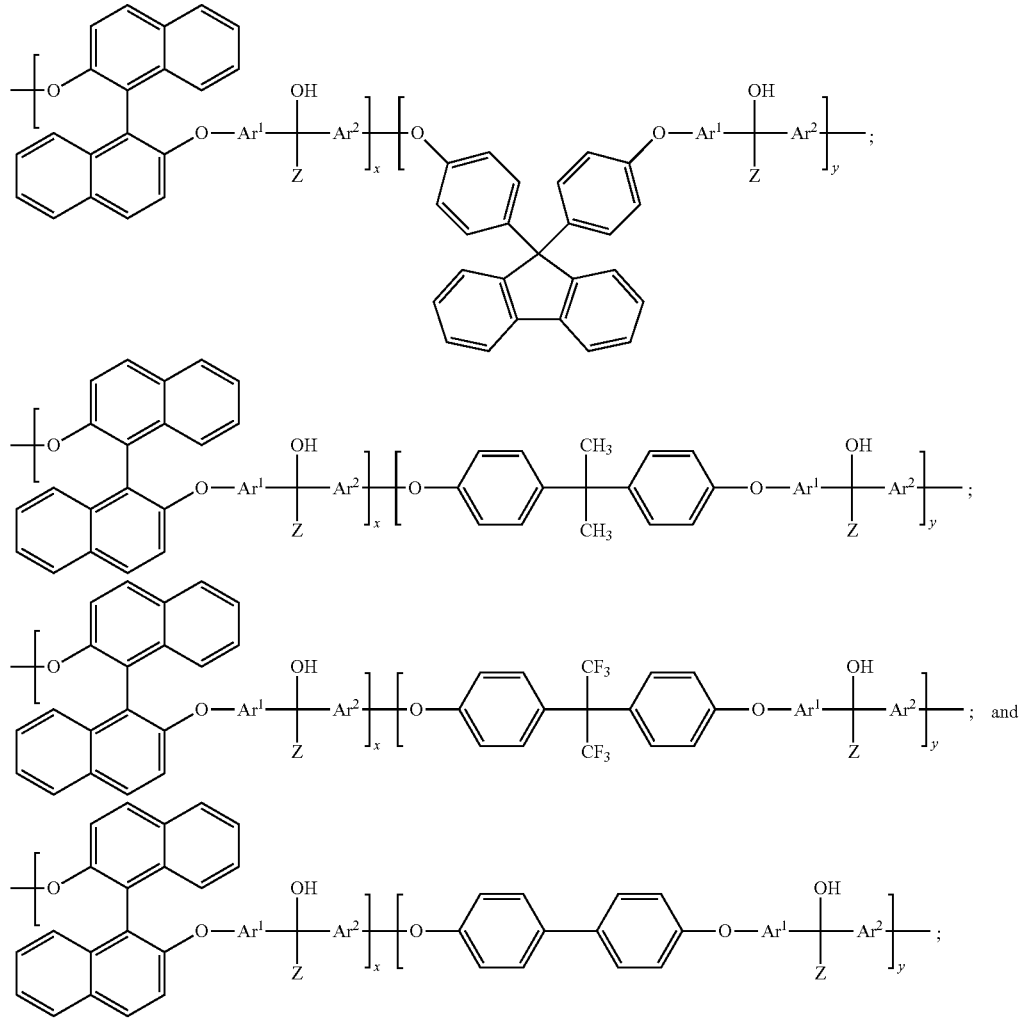

wherein x and y represent the number of each repeat units and are integers independently selected from 1 to 499, and wherein x+y=2 to 500; and a organic solvent.

* * * * *